United States Patent
Lee

(10) Patent No.: US 11,698,633 B2
(45) Date of Patent: Jul. 11, 2023

(54) SERVER RACK PREDICTIVE MAINTENANCE METHOD

(71) Applicant: ITS CO., LTD., Ulsan (KR)

(72) Inventor: Young Kyu Lee, Ulsan (KR)

(73) Assignee: ITS CO., LTD., Ulsan (KR)

( * ) Notice: Subject to any disclaimer, the term of this patent is extended or adjusted under 35 U.S.C. 154(b) by 0 days.

(21) Appl. No.: 17/846,237

(22) Filed: Jun. 22, 2022

(65) Prior Publication Data

US 2022/0317670 A1 Oct. 6, 2022

Related U.S. Application Data

(63) Continuation of application No. PCT/KR2020/017925, filed on Dec. 9, 2020.

(30) Foreign Application Priority Data

Dec. 23, 2019 (KR) .......................... 10-2019-0173227

(51) Int. Cl.
G05B 23/02 (2006.01)

(52) U.S. Cl.
CPC ........ *G05B 23/027* (2013.01); *G05B 23/0283* (2013.01)

(58) Field of Classification Search
CPC .............. G06F 11/3058; G06F 11/3006; G06F 11/3062; G06F 11/32; G06F 1/206;
(Continued)

(56) References Cited

U.S. PATENT DOCUMENTS 10,657,735 B2 * 5/2020 Tucker .................. G07C 5/006
11,232,862 B2 * 1/2022 Schriver .............. G05B 23/024
(Continued)

FOREIGN PATENT DOCUMENTS

KR       100920477 B1      10/2009
KR       100922893 B1      10/2009
(Continued)

OTHER PUBLICATIONS

Gang Niu, Bo-Suk Yang, Intelligent condition monitoring and prognostics system based on data-fusion strategy, Expert Systems with Applications, vol. 37, Issue 12, 2010, pp. 8831-8840 (https://www.sciencedirect.com/science/article/pii/S095741741000518X) (Year: 2010).*

*Primary Examiner* — Darrin D Dunn
(74) *Attorney, Agent, or Firm* — Lempia Summerfield Katz LLC

(57) ABSTRACT

A server rack predictive maintenance method comprises: an information collecting step of measuring and collecting the value of power consumed by a main wire for supplying power to a fan and pieces of equipment in a normal operating state of a server rack in which the internal temperature and humidity are maintained to be constant through the fan; an alarm setting step of setting the average current value of the server rack on the basis of the value of power collected in the information collecting step, and setting the alarm current value to be smaller than the set average current value; and a detecting step of detecting the server rack as an abnormal state when the value of power consumed by the main wire, having been measured in a real-time operating state of the server rack, is formed less than the alarm current value.

3 Claims, 9 Drawing Sheets

Figure 1:
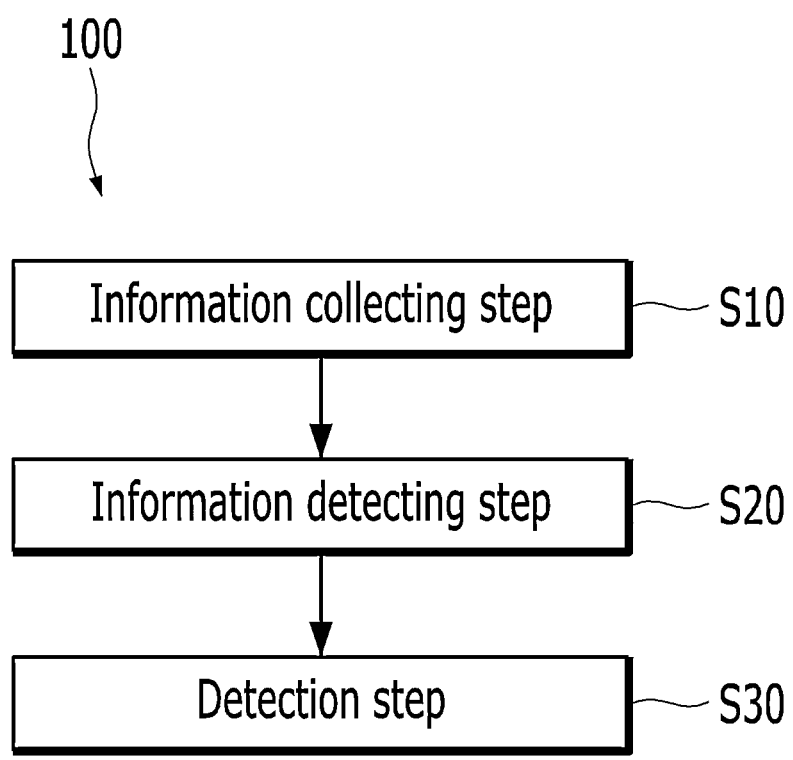

(58) Field of Classification Search
CPC .... G06F 11/30; G06F 1/3206; G06F 11/3044; G06F 11/0751; G06F 11/0754; G06F 11/0757; G06F 11/2294; G06F 11/3089; G06F 11/327; G06F 11/3476; G06F 11/22; G06Q 50/06; G05B 23/0235; G05B 23/0267; G05B 23/0275; G05B 23/0283; G05B 23/0286; G05B 23/027; G08B 21/18; G08B 21/182; G08B 21/185; H05K 7/20; H05K 7/20718

See application file for complete search history.

(56) References Cited

U.S. PATENT DOCUMENTS

| | | | |
|---|---|---|---|
| 2012/0136498 | A1 | 5/2012 | Chen et al. |
| 2017/0085413 | A1* | 3/2017 | Cencini ................ G06F 9/4416 |
| 2017/0220092 | A1* | 8/2017 | Kodama ............... G06F 1/3234 |
| 2019/0108691 | A1* | 4/2019 | Tucker ............... G05B 23/0232 |
| 2019/0260829 | A1* | 8/2019 | Cencini ................ G06F 1/206 |
| 2021/0075854 | A1* | 3/2021 | Cencini ................ H04L 41/24 |
| 2021/0339353 | A1 | 11/2021 | Lee |
| 2021/0406742 | A1* | 12/2021 | Ledbetter .............. G06N 7/005 |
| 2022/0263702 | A1* | 8/2022 | Cencini ................ H04L 41/044 |

FOREIGN PATENT DOCUMENTS

| | | |
|---|---|---|
| KR | 20120076244 A | 7/2012 |
| KR | 101592466 B1 | 2/2016 |
| KR | 20170100762 A | 9/2017 |
| KR | 101865151 B1 | 6/2018 |
| KR | 20180068102 A | 6/2018 |
| KR | 102004156 B1 | 8/2019 |
| KR | 20200081165 A | 7/2020 |

\* cited by examiner

SERVER RACK PREDICTIVE MAINTENANCE METHOD

CROSS-REFERENCE TO RELATED APPLICATIONS

This application is a continuation of International Patent Application No. PCT/KR2020/017925, filed Dec. 9, 2020, which claims priority to and the benefit of Korean Patent Application 10-2019-0173227, filed Dec. 23, 2019, the entirety of each of which is incorporated herein by reference.

FIELD

The present disclosure relates to a server rack predictive maintenance method. More particularly, the present disclosure relates to a server rack predictive maintenance method, which sets an alarm current value for power consumed by a server rack based on information collected in a normal operating state of the server rack; and sets alarm vibration and temperature values (alarm values) for vibration and a temperature, respectively, which may occur in the server rack. Then, when an abnormal symptom in which a power value consumed in a real-time operating state of the server rack is formed to be less than the alarm current value or the vibration and temperature values of the server rack exceed the alarm vibration and temperature values is detected, the method induces inspection of the server rack at an appropriate time by alarming to prevent enormous monetary losses due to damage and failure of the server rack and equipment in advance.

BACKGROUND

The statements in this section merely provide background information related to the present disclosure and may not constitute prior art.

In general, server racks are used to efficiently use small spaces when constructing a computer room and to stably protect servers and network equipment (hereinafter, referred to as 'equipment').

However, since the equipment is installed (mounted) on the server rack, heat generated by an operation of the equipment is continuously accumulated and a temperature thus increases therein. As a result, the humidity may be increased.

The increase in temperature and humidity inside the server rack is caused by the equipment mounted on the server rack but may also become a failure cause of the server. As a result, a fan discharging air to the inside is provided on the top of the server rack.

When the failure occurs in the server rack, overheating of the equipment accommodated in the server rack cannot be prevented. As a result, enormous losses in which the equipment installed in the server rack is damaged or has the failure are caused. Further, large losses cannot but be generated in operating expenses wasted while the equipment is interrupted jointly with repairing cost by downtime generation due to the failure of the server rack or the equipment, and business may be affected.

Accordingly, a predictive maintenance method is urgently required, which detects the abnormal symptom generated before the failure of the server rack occurs and performs the inspection or repair in advance before the failure of the server rack occurs to prevent the enormous losses, which can be generated due to the failure of the server rack.

SUMMARY

The present disclosure provides a server rack predictive maintenance method, which sets an alarm current value for power consumed by a server rack based on information collected in a normal operating state of the server rack; and sets alarm vibration and temperature values (alarm values) for vibration and a temperature, respectively, which may occur in the server rack. Then, when an abnormal symptom in which a power value consumed in a real-time operating state of the server rack is formed to be less than the alarm current value or the vibration and temperature values of the server rack exceed the alarm vibration and temperature values is detected, the method induces inspection of the server rack at an appropriate time by alarming to prevent enormous monetary losses due to damage and failure of the server rack and equipment in advance.

Further, the present disclosure also provides a server rack predictive maintenance method, which sets an alarm value of each of vibration and a temperature generated jointly with power consumed while the server rack operates. The method also detects and alarms a real-time abnormal symptom of the server rack at various alarm levels based on each alarm value to induce appropriate response of an administrator and secure excellent reliability for a detection result.

A server rack predictive maintenance method according to the present disclosure includes an information collecting step (S10) of measuring and collecting a power value consumed in a main wire for supplying power to a fan and pieces of equipment in a normal operating state of a server rack in which the internal temperature and humidity are maintained to be constant through the fan supplying air to the pieces of equipment installed in an internal space. The method also includes an alarm setting step (S20) of setting an average current value of the server rack based on the power value collected in the information collecting step (S10), and then setting an alarm current value to be smaller than the set average current value. The method also includes a detection step (S30) of detecting that the server rack is in an abnormal state when the power value consumed by the main wire measured in the real-time operating state of the server rack is formed to be less than the alarm current value.

Further, in the information collecting step (S10), the vibration generated in the server rack is further measured in the normal operating state of the server rack, and the measured vibration value is collected. In the alarm setting step (S20), an average vibration value of the server rack is set based on the vibration value collected in the information collecting step (S10), and then the alarm vibration value having a value larger than the set average vibration value is set. In the detection step (S30), when the vibration value measured in the real-time operating state of the server rack exceeds the alarm vibration value, the abnormal state of the server rack is detected. When the power value of the real-time operating state of the server rack is formed to be less than the alarm current value or the real-time vibration value of the server rack exceeds the alarm vibration value, it is judged and alarmed that the server rack is in an alarm state, and when the power value of the real-time operating state of the server rack is formed to be less than the alarm current value and the real-time vibration value of the server rack exceeds the alarm vibration value, it is judged and alarmed that the server rack is in a risk state.

Further, in the information collecting step (S10), a temperature generated in the server rack is further measured in the normal operating state of the server rack, and the measured temperature value is collected. In the alarm setting step (S20), an average temperature value of the server rack is set based on the temperature value collected in the information collecting step (S10), and then the alarm temperature value having a value larger than the set average temperature value is set. In the detection step (S30), when the temperature value measured in the real-time operating state of the server rack exceeds the alarm temperature value, the abnormal state of the server rack is detected. When the power value of the real-time operating state of the server rack is formed to be less than the alarm current value or the vibration value exceeds the alarm vibration value or the temperature value exceeds the alarm temperature value, it is judged and alarmed that the server rack is in an alarm state. When two values of the power value, the vibration value, and the temperature value of the real-time operating state of the server rack are less than or more than the alarm value (the alarm current, vibration, and temperature values), it is judged and alarmed that the server rack is in the more serious risk than the alarm state. When the power value of the real-time operating state of the server rack is formed to be less than the alarm current value and the vibration value exceeds the alarm vibration value or the temperature value exceeds the alarm temperature value, it is judged and alarmed that the server rack is in an emergency state at a more serious level than the risk state.

By the server rack predictive maintenance method according to the present disclosure, there is an effect that an alarm current value for power consumed by a server rack is set based on information collected in a normal operating state of the server rack. Alarm vibration and temperature values (alarm values) for vibration and a temperature, respectively, which may occur in the server rack, are set. Then, when an abnormal symptom in which a power value consumed in a real-time operating state of the server rack is formed to be less than the alarm current value or the vibration and temperature values of the server rack exceed the alarm vibration and temperature values is detected, inspection of the server rack is induced at an appropriate time by alarming to prevent enormous monetary losses due to damage and failure of the server rack and equipment in advance.

Further, there is an effect that an alarm value of each of vibration and a temperature generated jointly with power consumed while the server rack operates is set and a real-time abnormal symptom of the server rack is detected and alarmed at various alarm levels based on each alarm value to induce appropriate response of an administrator and secure excellent reliability for a detection result.

DRAWINGS

In order that the disclosure may be well understood, there will now be described various forms thereof, given by way of example, reference being made to the accompanying drawings, in which:

FIG. 1 is a block diagram of a server rack predictive maintenance method according to an embodiment of the present disclosure; and FIGS. 2-9 are diagrams for respectively describing the server rack predictive maintenance method illustrated in FIG. 1.

The drawings described herein are for illustration purposes only and are not intended to limit the scope of the present disclosure in any way.

DETAILED DESCRIPTION

The present disclosure relates to a server rack predictive maintenance method including an information collecting step (S10) of measuring and collecting a power value consumed in a main wire for supplying power to a fan and pieces of equipment in a normal operating state of a server rack in which the internal temperature and humidity are maintained to be constant through the fan supplying air to the pieces of equipment (a server and a network equipment) installed in an internal space. The method also includes an alarm setting step (S20) of setting an average current value of the server rack based on the power value collected in the information collecting step (S10), and then setting an alarm current value to be smaller than the set average current value. The method also includes a detection step (S30) of detecting that the server rack is in an abnormal state when the power value consumed by the main wire measured in the real-time operating state of the server rack is formed to be less than the alarm current value.

A server rack predictive maintenance method according to an embodiment of the present disclosure is described in detail with reference to the accompanying drawings. The detailed description of publicly-known function and configuration that may make the gist of the present disclosure unnecessarily ambiguous have been omitted.

FIGS. 1-9 illustrate a server rack predictive maintenance method according to an embodiment of the present disclosure. FIG. 1 is a block diagram of a server rack predictive maintenance method according to an embodiment of the present disclosure. FIGS. 2-9 illustrate diagrams for describing the server rack predictive maintenance method illustrated in FIG. 1, respectively.

As illustrated in the figures, the server rack predictive maintenance method 100 according to the embodiment of the present disclosure includes an information collecting step (S10), an alarm setting step (S20), and a detection step (S30).

As illustrated in FIG. 1, the information collecting step (S10) is a step of measuring and collecting a power value consumed in a main wire for supplying power to a fan and pieces of equipment in a normal operating state of a server rack in which the internal temperature and humidity are maintained to be constant through the fan supplying air to the pieces of equipment (a server and a network equipment) installed in an internal space.

The collected information is used as information for setting an alarm current value for detecting an abnormal symptom of the server rack in the information setting step (S20) to be described below.

As illustrated in FIG. 1, the alarm setting step (S20) is a step of setting an average current value of the server rack based on the power value collected in the information collecting step (S10), and then setting the alarm current value to be smaller than the set average current value.

Figure 2:
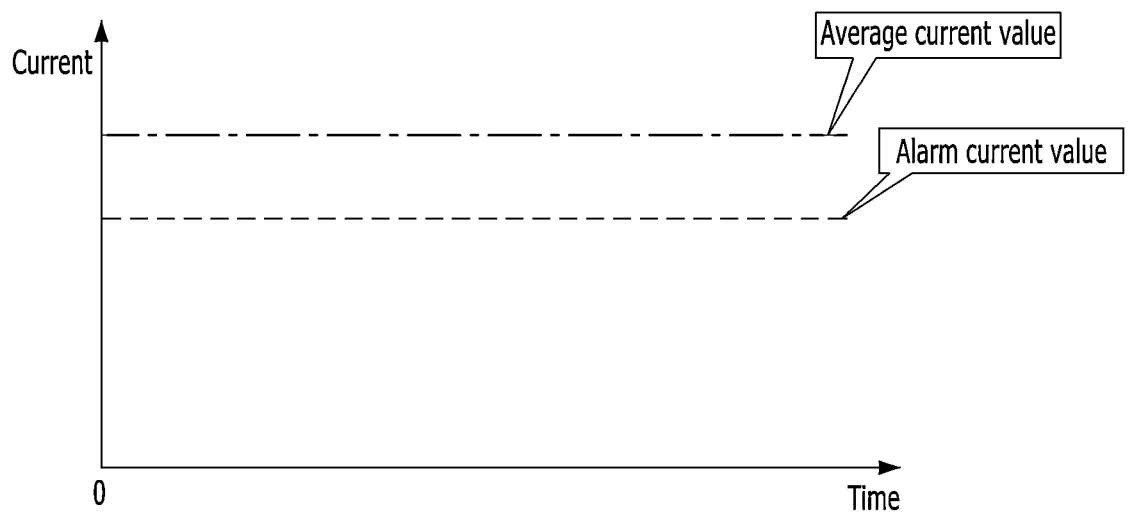

Here, the alarm current value is set based on the power value consumed by the main wire in the normal state of the server rack as illustrated in FIG. 2, and the alarm current value set in this case is set to a value smaller than the average current value acquired by averaging the power value consumed in the normal state of the server rack, and the reason is described below.

The alarm current value as a threshold value for detecting the abnormal symptom of the server rack may be set to various values by considering conditions including the type of equipment installed in the server rack, the used power amount, the number of fans, and an installation environment, of course, and the alarm current value are classified and set to an alarm threshold value, a risk threshold value, etc., and various levels for the alarm are formed to alarm the abnormal symptom of the server rack, of course.

As illustrated in FIG. 1, the detection step (S30) is a step of detecting that the server rack is in the abnormal state when the power value consumed by the main wire measured in the real-time operating state of the server rack is formed to be less than the alarm current value.

Figure 3:
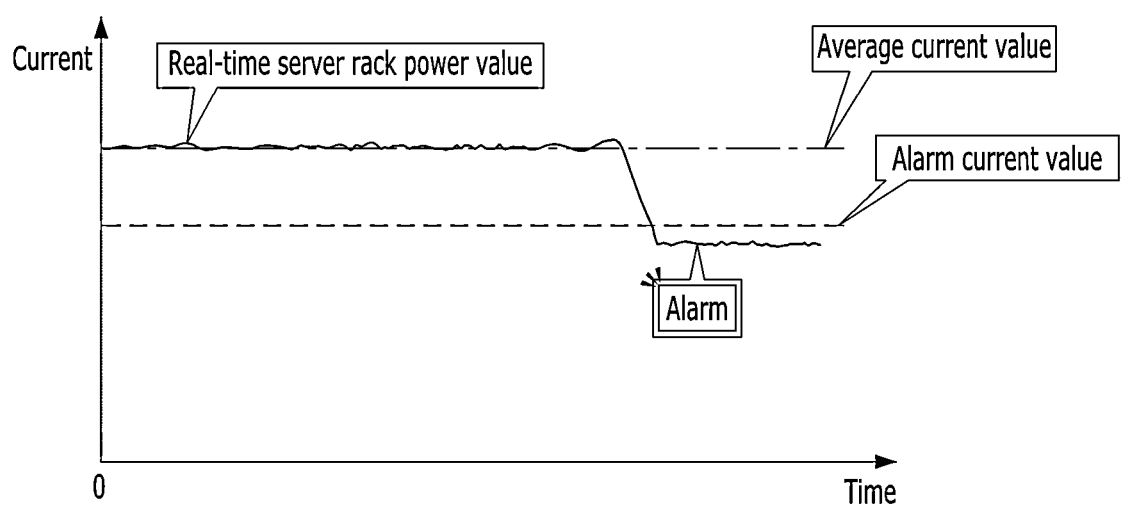

In one embodiment, as illustrated in FIG. 3, the power value consumed by the main wire in the real-time operating state of the server rack and the alarm current value are compared. When the real-time power value of the server rack becomes lower than the alarm current value, inspection and management of the server rack are induced by alarming to an administrator. The reason is that when multiple equipment and fans installed in the server rack are generally operated by receiving the power from the main wire, and a constant amount of power is continuously used, but a component such as any one of the equipment, the fans, or a fan (not illustrated) installed in the equipment stops the operation due to a reason such as the failure, the consumption of the power is stopped in the component having the failure, and thus the power value (size) consumed by the main wire is reduced.

Accordingly, when the power value consumed by the main wire decreases, the failure of the fan or the equipment installed in the server rack is suspected and it is necessary to inspect the server rack, and the alarm current value for inducing the determination for the inspection is naturally set to a value smaller than the power value consumed in the normal state of the server rack, of course.

Meanwhile, in the information collecting step (S10), the vibration generated in the server rack is further measured in the normal operating state of the server rack, and the measured vibration value is collected.

The collected vibration value of the server rack is used as information for setting an alarm vibration value for detecting the abnormal symptom of the server rack like the power value of the server rack.

Thereafter, in the alarm setting step (S20), an average vibration value of the server rack is set based on the vibration value collected in the information collecting step (S10), and then the alarm vibration value having a value larger than the set average vibration value is set.

Figure 4:
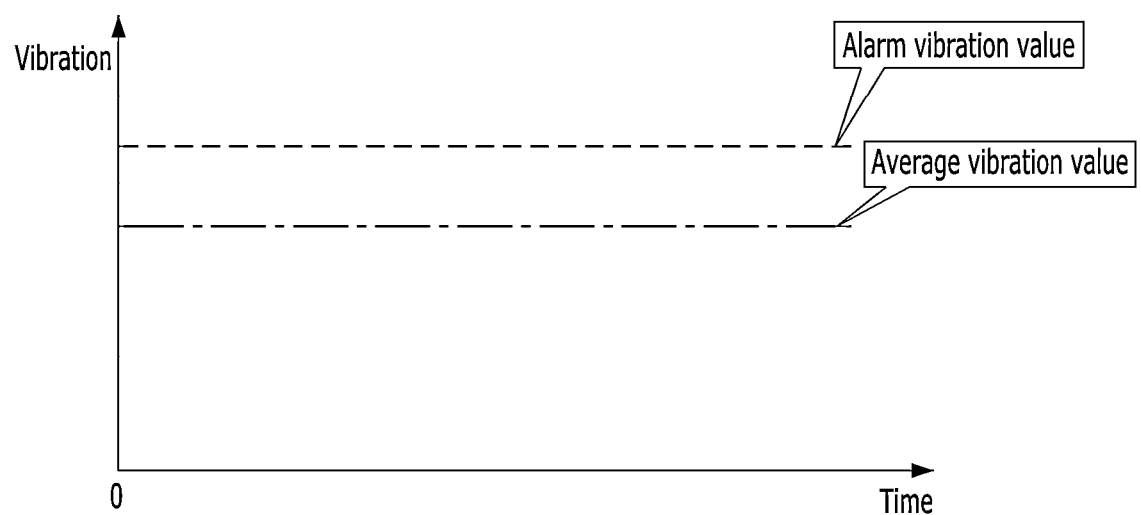

In other words, the alarm vibration value is set based on the vibration value generated in the normal state of the server rack as illustrated in FIG. 4, and the alarm vibration value set in this case is set to a value larger than the average vibration value acquired by averaging the vibration value generated in the normal state of the server rack. The reason is that when the fan installed in the server rack or the fain embedded in the equipment is deteriorated due to a long-term use, shaking (vibration) of the ventilator or fan is generated during an operating process.

Accordingly, when the vibration of the server rack is gradually generated to be large, a function is deteriorated or the failure is suspected due to aging of the fan installed in the server rack or the fan of the equipment. As a result, it is desired to inspect the server rack, and the alarm vibration value for inducing the determination for the inspection is naturally set to a value larger than the vibration value generated in the normal state of the server rack, of course.

The alarm vibration value as a threshold value for detecting the abnormal symptom of the server rack may be set to various values by considering the conditions including the type of equipment installed in the server rack, the used power amount, the number of fans, and the installation environment.

Thereafter, in the detection step (S30), when the vibration value measured in the real-time operating state of the server rack exceeds the alarm vibration value, the abnormal state of the server rack is detected.

Figure 5:
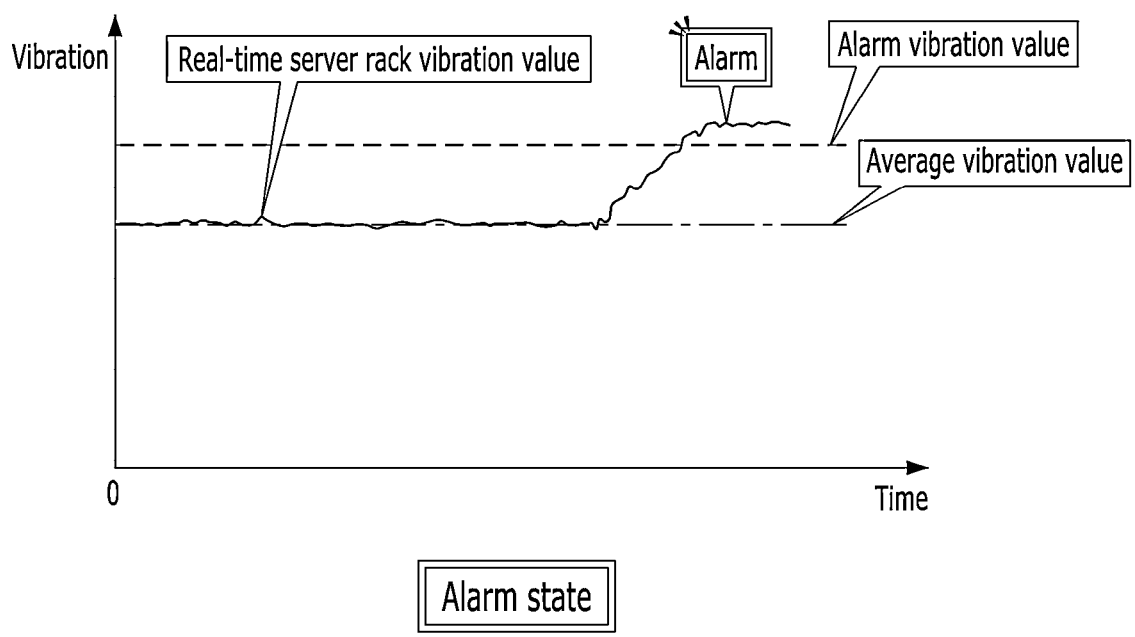

In other words, as illustrated in FIG. 5, when the power value of the real-time operating state of the server rack is set to be less than the alarm current value or the real-time vibration value of the server rack exceeds the alarm vibration value, it is judged and alarmed that the server rack is in an alarm state.

Figure 6:
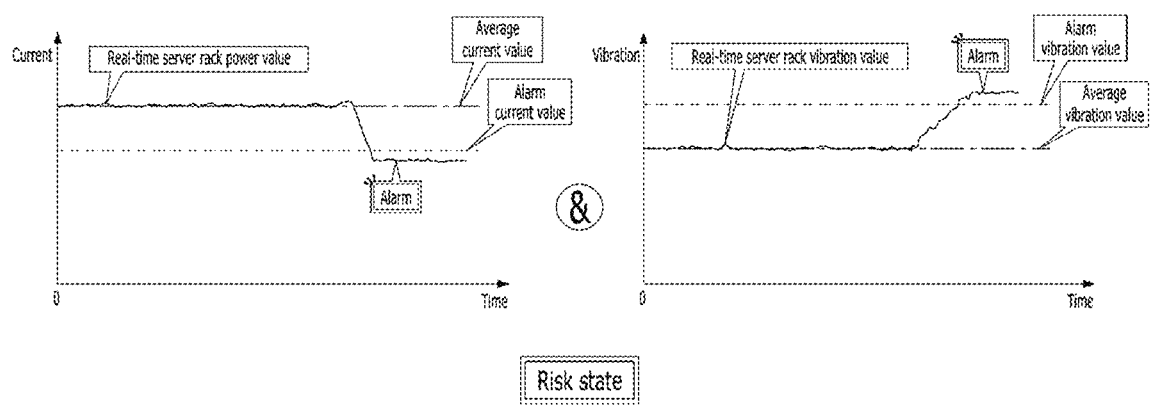

As illustrated in FIG. 6, when the power value of the real-time operating state of the server rack is formed to be less than the alarm current value and the real-time vibration value of the server rack exceeds the alarm vibration value, it is judged and alarmed that the server rack is in a risk state.

Accordingly, the server rack predictive maintenance method 100 according to the present disclosure detects the real-time operating state of the server rack based on two values of the power and the vibration generated from the server rack. The method also alarms an alarm state in which the inspection of the server rack is required when one value of the power and the vibration is less than or more than an alarm value (alarm current and vibration values) and alarms a risk state in which a rapid inspection is required jointly with a special interest and attention at a more serious level than the alarm state when the power value is formed to be less than the alarm current value and the vibration value is more than the alarm vibration value.

Meanwhile, in the information collecting step (S10), the temperature generated in the server rack is further measured in the normal operating state of the server rack, and the measured temperature value is collected.

The collected temperature value of the server rack is used as information for setting an alarm temperature value for detecting the abnormal symptom of the server rack like the power value of the server rack.

Thereafter, in the alarm setting step (S20), an average temperature value of the server rack is set based on the temperature value collected in the information collecting step (S10), and then the alarm temperature value having a value larger than the set average temperature value is set.

Figure 7:
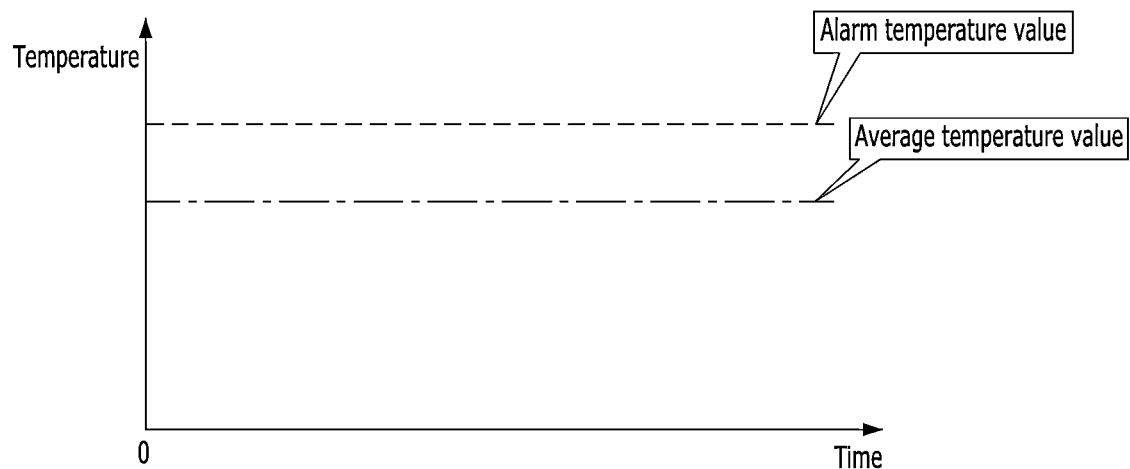

In other words, the alarm temperature value is set based on the temperature generated in the normal state of the server rack as illustrated in FIG. 7. The alarm temperature value set in this case is set to a value larger than the average temperature value acquired by averaging the temperature generated in the normal state of the server rack. The reason is that when the function of the fan installed in the server rack or the fan embedded in the equipment is deteriorated due to the damage/failure, smooth cooling of the server rack is difficult, and thus the temperature of the server rack is gradually increased.

Accordingly, when the temperature of the server rack is gradually increased to be large, the damage, the failure, the functional deterioration, etc., of the fan installed in the server rack or the fan of the equipment are suspected, and as a result, it is necessary to inspect the server rack. The alarm temperature value for inducing the determination for the inspection is naturally set to a temperature higher than the temperature generated in the normal state of the server rack, of course.

The alarm temperature value as a threshold value for detecting the abnormal symptom of the server rack may be set to various values by considering the conditions including the type of equipment installed in the server rack, the used power amount, the number of fans, and the installation environment.

Thereafter, in the detection step (S30), when the temperature value measured in the real-time operating state of the server rack exceeds the alarm temperature value, the abnormal state of the server rack is detected.

Figure 8:
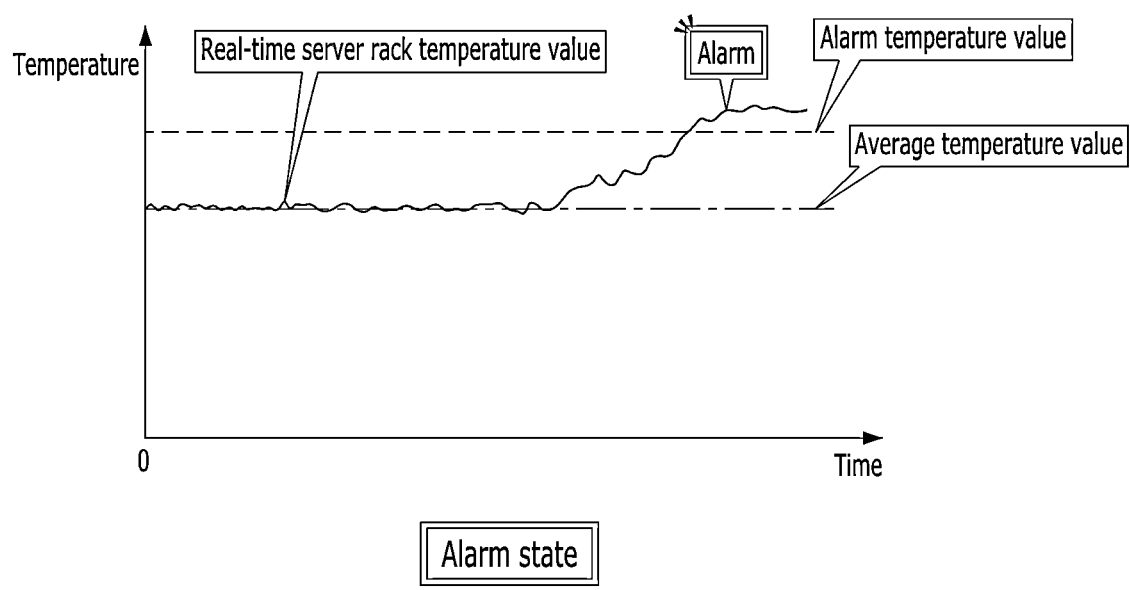

In other words, as illustrated in FIG. 8, when the power value of the real-time operating state of the server rack is formed to be less than the alarm current value or the vibration value exceeds the alarm vibration value or the temperature value exceeds the alarm temperature value, it is judged and alarmed that the server rack is in an alarm state.

As illustrated in FIG. 6, when two values of the power value, the vibration value, and the temperature value of the real-time operating state of the server rack are less than or more than the alarm value (the alarm current, vibration, and temperature values), it is judged and alarmed that the server rack is in the more serious risk than the alarm state.

Figure 9:
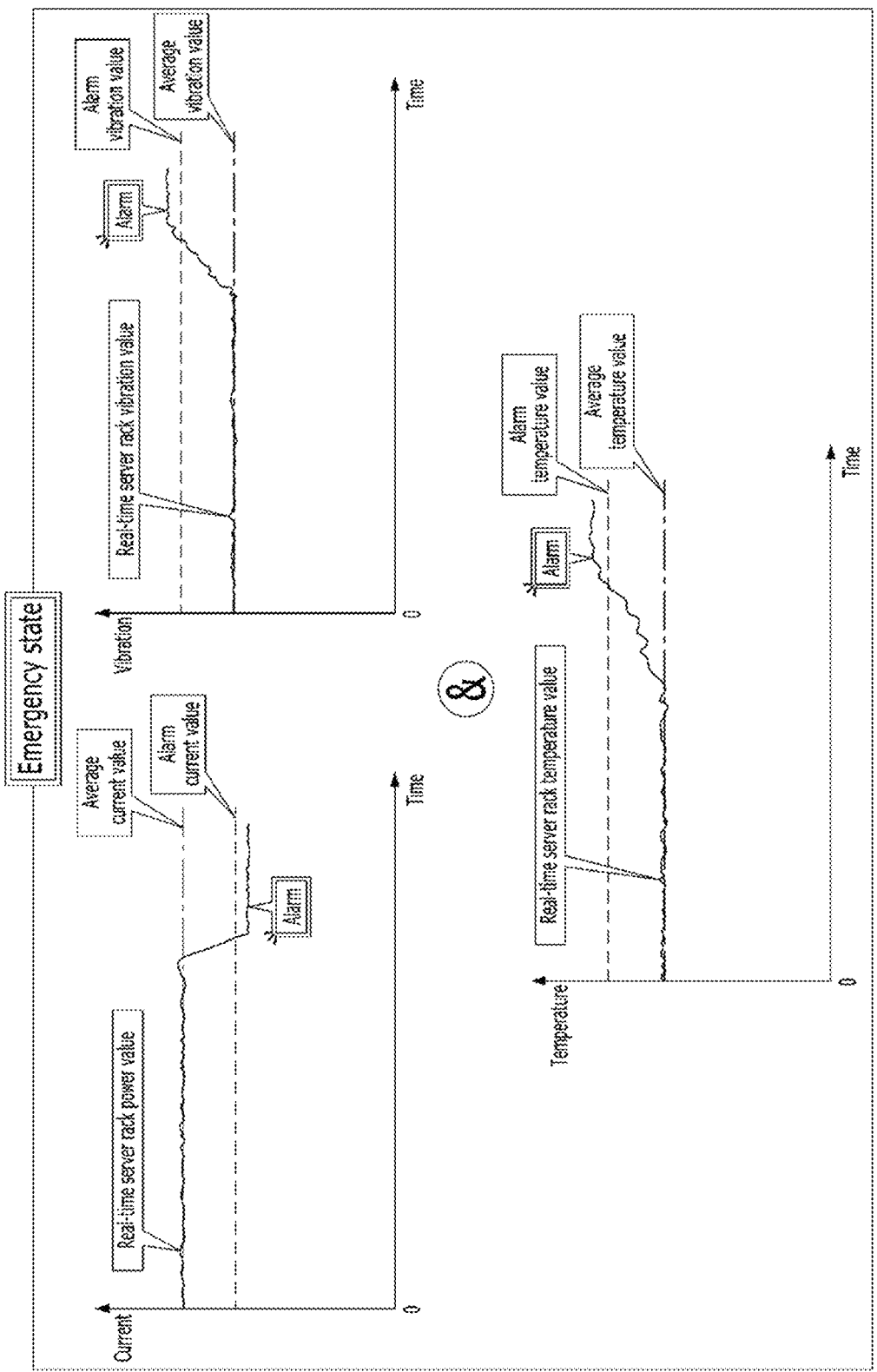

As illustrated in FIG. 9, when the power value of the real-time operating state of the server rack is formed to be less than the alarm current value and the vibration value exceeds the alarm vibration value and the temperature value exceeds the alarm temperature value, it is judged and alarmed that the server rack is in an emergency state at a more serious level than the risk state.

Accordingly, the server rack predictive maintenance method 100 according to the present disclosure detects the real-time operating state of the server rack based on three values of the power, the vibration, and the temperature generated from the server rack. The method 100 also alarms an alarm state in which the inspection of the server rack is required when one value of the power, the vibration, and the temperature less than or more than an alarm value (alarm current, vibration, and temperature values). The method 100 also alarms a risk state in which a rapid inspection is required jointly with a special interest and attention at a more serious level than the alarm state when two values of the power, the vibration, and the temperature are less than or more than the alarm value. The method 100 also alarms an emergency state of the server rack in which a rapid inspection is particularly required at a more serious level than the risk state when all values of the power, the vibration, and the temperature are more than the alarm value.

Therefore, the server rack predictive maintenance method 100 according to the present disclosure may detect the operating state of the server rack very precisely and effectively in real time and secure excellent reliability for a detection result by detecting the state of the server rack through various detection conditions.

By the server rack predictive maintenance method 100 according to the present disclosure, which is conducted by such a process, there is an effect that an alarm current value for power consumed by a server rack is set based on information collected in a normal operating state of the server rack, and alarm vibration and temperature values (alarm values) for vibration and a temperature, respectively, which may occur in the server rack, are set. Then, when an abnormal symptom in which a power value consumed in a real-time operating state of the server rack is formed to be less than the alarm current value or the vibration and temperature values of the server rack exceed the alarm vibration and temperature values is detected, inspection of the server rack is induced at an appropriate time by alarming to prevent enormous monetary losses due to damage and failure of the server rack and equipment in advance.

Further, there is an effect that an alarm value of each of vibration and a temperature generated jointly with power consumed while the server rack operates is set and a real-time abnormal symptom of the server rack is detected and alarmed at various alarm levels based on each alarm value to induce appropriate response of an administrator and secure excellent reliability for a detection result.

The present disclosure has been described with reference to the embodiment illustrated in the accompanying drawings and is just exemplary and is not limited to the above-described embodiments. It should be appreciated by those having ordinary skill in the art that various modifications and embodiments equivalent thereto may be made therefrom. In addition, modifications by those having ordinary skill in the art may be made without departing from the scope of the present disclosure. Therefore, the scope of the claims in the present disclosure should not be defined by the scope of the detailed description, but should be defined by the following claims and the technical spirit thereof.

What is claimed is:

1. A server rack predictive maintenance method, comprising:
   supplying, by a fan, air to a server and a network equipment installed in an internal space of a server rack;
   detecting that the server rack is in a normal operating state when internal temperature and humidity of the server rack are maintained constant while supplying, by the fan, the air to the server and the network equipment;
   supplying, by a main wire, power to the fan, the server, and the network equipment;
   collecting a power value consumed in the main wire for supplying the power to the fan, the server, and the network equipment when the server rack is in the normal operating state;
   collecting a vibration value generated by the server rack when the server rack is in the normal operating state;
   setting an average current value of the server rack based on the collected power value and setting an alarm current value to be smaller than the set average current value;
   setting an average vibration value of the server rack based on the collected vibration value and setting an alarm vibration value to be larger than the set average vibration value;
   measuring real-time power values consumed by the main wire while supplying, by the fan, the air to the server and the network equipment;
   measuring real-time vibration values of the server rack while supplying, by the fan, the air to the server and the network equipment;
   detecting that the server rack is in an abnormal state when at least one measured real-time power value among the measured real-time power values is less than the alarm current value or when at least one measured real-time vibration value of the server rack among the measured real-time vibration values of the server rack exceeds the alarm vibration value;
   detecting that the server rack is in a risk state when the at least one measured real-time power value is less than the alarm current value and the at least one measured real-time vibration value of the server rack exceeds the alarm vibration value; and
   alarming that the server rack is in the abnormal state of the server rack or in the risk state of the server rack.

2. The server rack predictive maintenance method according to claim 1, further comprising:
   collecting a temperature value generated by the server rack when the server rack is in the normal operating state;

setting an average temperature value of the server rack based on the collected temperature value and setting an alarm temperature value to be larger than the set average temperature value;

measuring real-time temperature values of the server rack while supplying, by the fan, the air to the server and the network equipment;

detecting that the server rack is in the abnormal state when at least one measured real-time temperature value of the server rack among the measured real-time temperature values of the server rack exceeds the alarm temperature value; and alarming that the server rack is in the abnormal state of the server rack.

3. The server rack predictive maintenance method according to claim 2, further comprising:

detecting that the server rack is in an emergency state when the at least one measured real-time power value is less than the alarm current value, the at least one measured real-time vibration value of the server rack exceeds the alarm vibration value, and the at least one measured real-time temperature value of the server rack exceeds the alarm temperature value; and alarming that the server rack is in the emergency state of the server rack.

* * * * *